Figure 1:
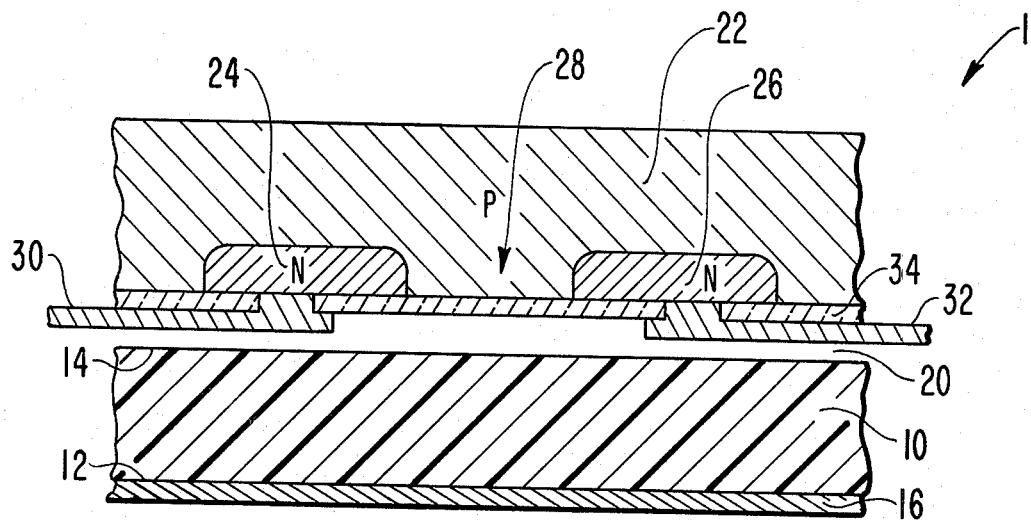

United States Patent [19]

Goodman

[11] 4,106,107

[45] Aug. 8, 1978

[54] MIS READOUT DEVICE WITH DIELECTRIC STORAGE MEDIUM

[75] Inventor: Alvin Malcolm Goodman, Princeton, N.J.

[73] Assignee: RCA Corporation, New York, N.Y.

[21] Appl. No.: 765,293

[22] Filed: Feb. 3, 1977

[51] Int. Cl.[2] .................. G11C 7/00; G11C 11/34
[52] U.S. Cl. .......................... 365/191; 179/100.1 B; 307/304; 324/32; 365/149; 365/45
[58] Field of Search .............. 340/173 CR; 307/304; 324/32; 179/100.1 B; 365/45, 149, 177, 244, 191

[56] References Cited

U.S. PATENT DOCUMENTS 3,842,194  10/1974  Clemens ............ 179/100.1 B
3,920,930  11/1975  Sobczyk ............ 179/100.1 B

OTHER PUBLICATIONS

David F. Hoeschele, Jr., *Analog-To-Digital/-Digital-To-Analog Conversion Techniques*, Published 8/14/68, pp. 9-10, 358-360.

Primary Examiner—Bernard Konick
Assistant Examiner—Donald McElheny
Attorney, Agent, or Firm—H. Christoffersen; R. P. Williams; T. H. Magee

[57] ABSTRACT

A readout device is disclosed which comprises a substrate of semiconductive material having a source and drain region formed therein. These regions of the device are placed adjacent to the surface of a dielectric storage medium, selective portions of which, i.e. selective storage locations, are electrostatically charged. The dielectric storage medium has a layer of conductive material formed thereon to which a signal is applied in order to determine whether the storage location being accessed is charged, and, in one embodiment, to determine what the magnitude of that charge might be.

10 Claims, 6 Drawing Figures

MIS READOUT DEVICE WITH DIELECTRIC STORAGE MEDIUM

This invention relates to a device for reading out information stored in the form of electrostatic charges on sheets of dielectric material. This novel device provides means for reading out either analog or digital information from a dielectric storage medium and the device is suitable for use in arrays in which a large number of bits may be accessed simultaneously, accurately and quickly. The present invention contemplates the use of an MIS (metal insulator semiconductor) device as the basic readout element.

The use of MIS readout elements is well known. However, most known MIS readout elements serve a dual function, acting as both a memory element and a readout means at the same time. It would be desirable to develop an MIS readout element which is separable from its associated storage medium such that a small number of readout elements could process large quantities of stored information. MIS readout elements which are separable from their associated memory elements are known, e.g., see U.S. Pat. No. 3,626,157, issued to Smith on Dec. 7, 1971. There, an MIS readout element is disclosed which is capable of detecting the presence or absence of holes on a separable conductive storage medium supported on an insulating backing. However, the capability of the Smith device is limited in that it can only store and read information of a digital nature and also that the information storage medium is permanent, i.e., the medium once used for information storage may not be erased and used to store other information. U.S. Pat. No. 3,638,200 issued to LaPoint on Jan. 25, 1972, which also discloses the use of separable MIS readout elements, overcomes the limitations of Smith in that both analog and digital information may be stored. Further, the LaPoint memory element is reusable. However, new problems are introduced with the LaPoint device. LaPoint discloses the use of a capacitive memory element used with an MIS readout element. This arrangement is disadvantaged in that, since the charge is stored capacitively, it may quickly dissipate due to current leakage and thus information may not be stored for long periods. In fact, LaPoint implies that 48 hours may be the life span of information stored in his disclosed capacitive memory element.

Accordingly, there is a need for a storage medium that provides relatively permanent and yet erasable storage locations and an associated MIS readout element which is both separable from the storage medium and capable of reading information of both an analog and a digital nature.

Figure 2:
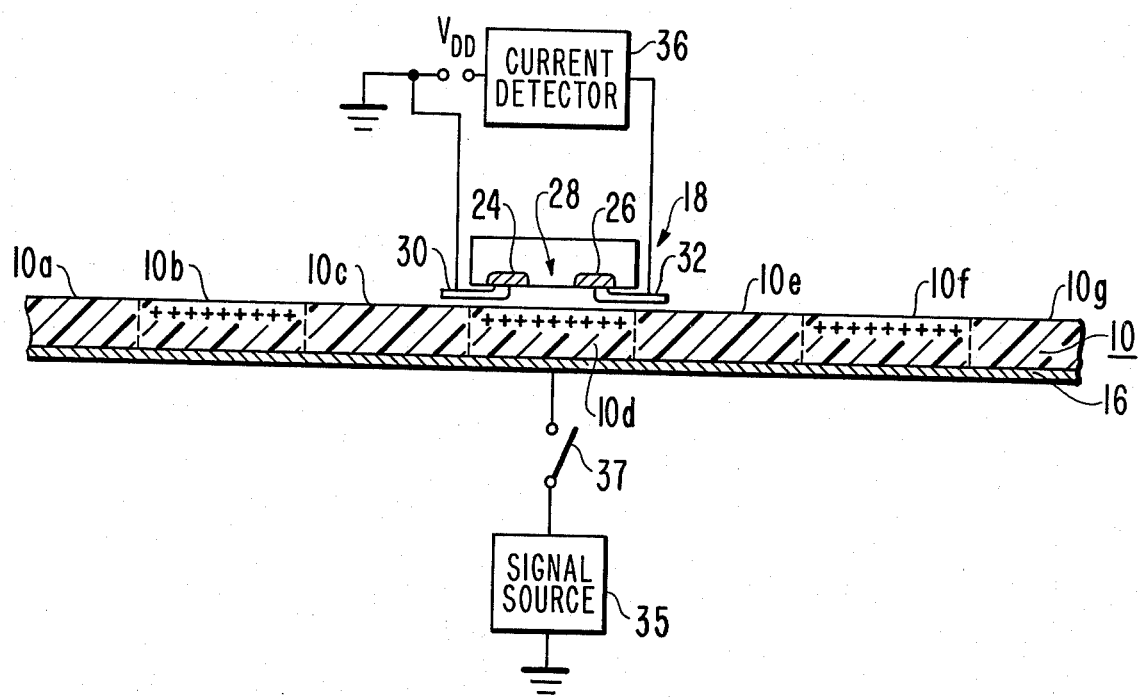
Figure 3:
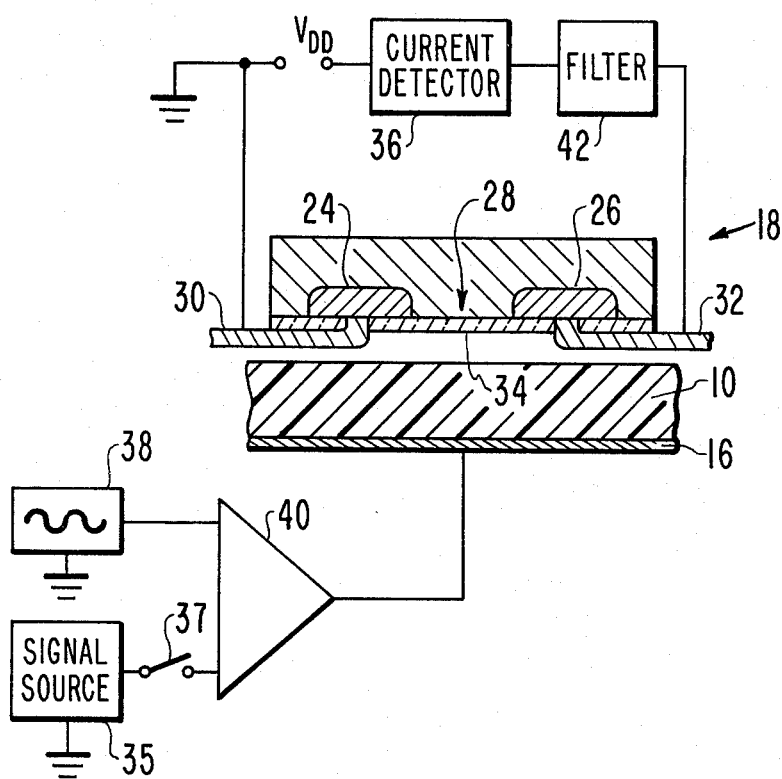
Figure 6:
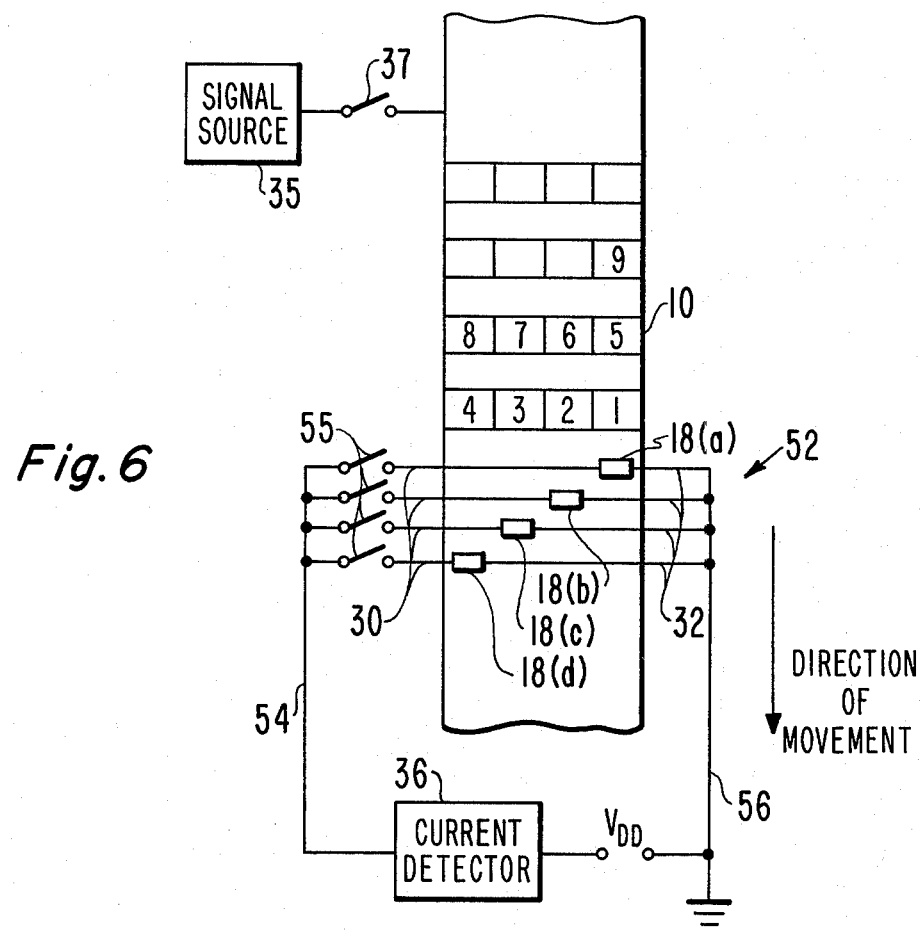
Figure 4:
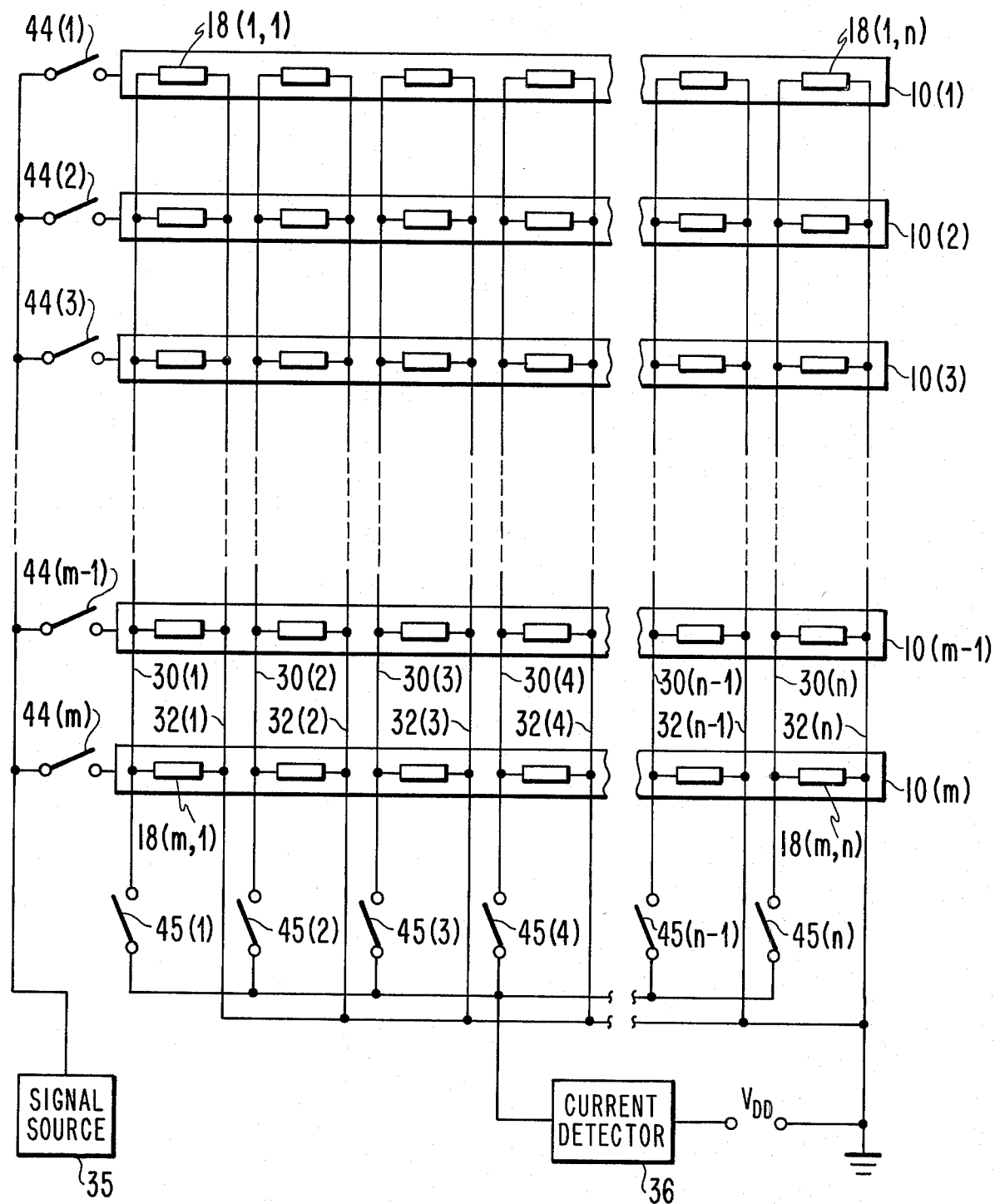
Figure 5:
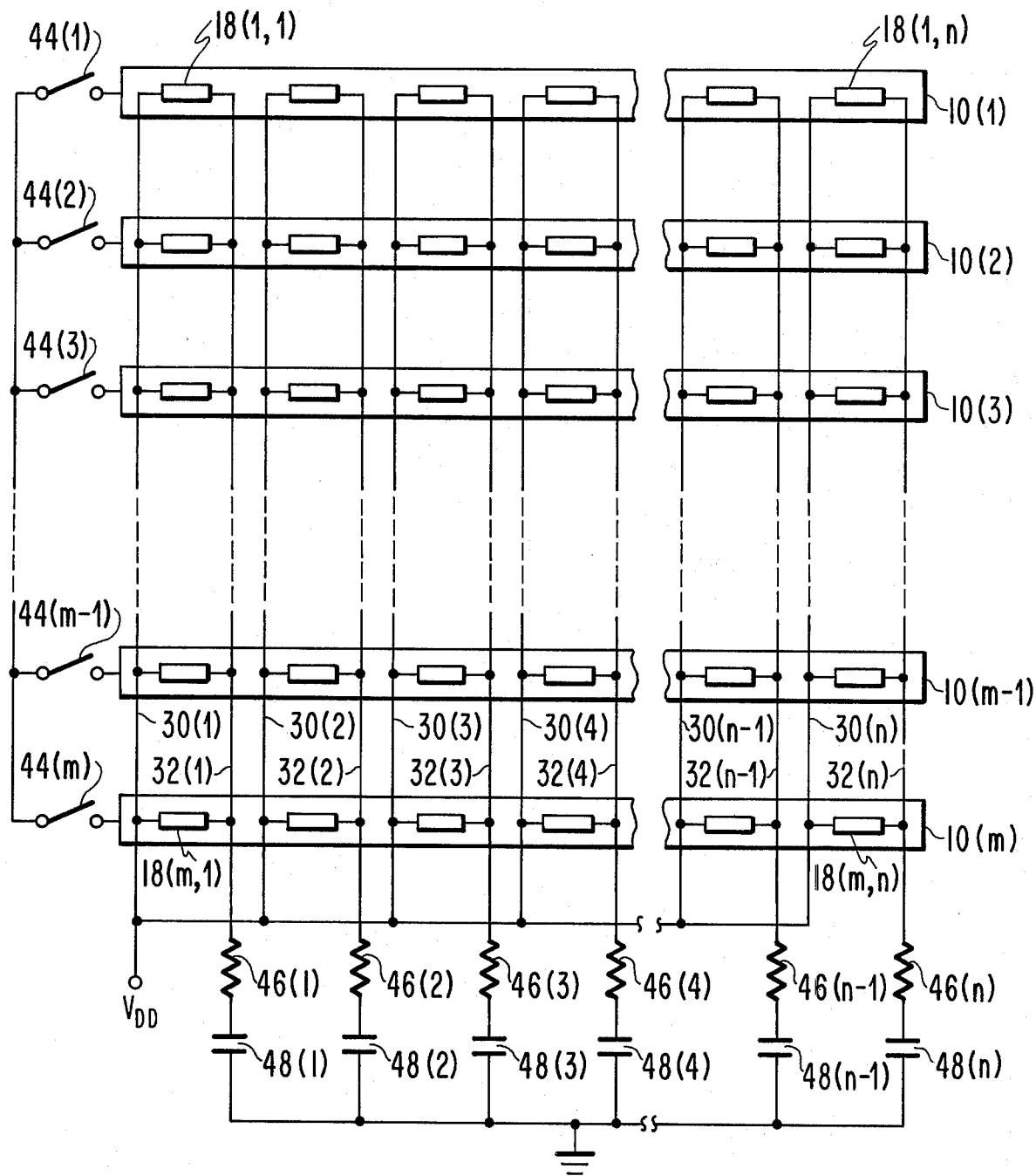

In the drawings:

FIG. 1 is a cross-sectional view of a dielectric storage medium and a single MIS readout element, FIG. 2 is a somewhat larger cross-section of a dielectric storage medium in conjunction with a readout element of the present invention, FIG. 3 illustrates a cross-section of a dielectric storage medium in conjunction with the readout element of the present invention, which has been adapted to prevent erroneous readouts, FIG. 4 is a schematic view of a plurality of dielectric storage media and an array of readout elements, FIG. 5 is a schematic view of an array similar to that shown in FIG. 4, but which is adapted to read out information a row at a time, FIG. 6 is a schematic of an array of readout elements which is capable of sequentially reading out all information stored on a dielectric storage medium.

Referring to FIG. 1, a section of a dielectric storage medium 10 in the form of a sheet or strip of dielectric material and an MIS readout element 18 may be seen. The dielectric storage medium has two opposite major surfaces 12 and 14. Formed on a first surface 12 by conventional methods is a sheet or layer 16 of conductive material. The dielectric storage medium 10 may be selected from a large class of materials including plastic materials such as acrylics, polycarbonates, polystyrenes, polytetrafluoroethylenes or polyethyleneterephthalates. The dielectric chosen could also be one which exhibits photoconductive effects such as selenium or one which exhibits ferroelectric properties such as barium titanate. The only requirement for the material selected for use as the dielectric storage medium 10 is that it be one capable of holding an electrostatic charge. However, it has been found that the plastic polycarbonate material known as "Lexan," marketed by Dupont Corporation, Wilmington, Delaware, is particularly suitable for maintaining a relatively permanent stored charge.

Methods of selectively charging the surfaces of a dielectric storage medium are well known to those skilled in the art. One example of such a method is that described in U.S. Pat. No. 3,872,480 issued to Rudolf Engelbrecht on Mar. 18, 1975 and assigned to RCA Corporation. By whatever charging method is used, information in the form of charges is thus located on selected portions of the surface 14 of the dielectric medium 10, and the information may be read out by placing the surface 14 of the dielectric storage medium 10 immediately adjacent the active surface of the MIS readout element 18 in accordance with the present invention. The dielectric storage medium 10 and the MIS readout element 18 may be separated by an air gap 20 or other gaseous dielectric so long as the width of the gap is small in comparison with the thickness of the dielectric storage medium 10. Alternatively, the readout device 18 may be disposed directly on the surface 14 of the dielectric storage medium 10.

The MIS readout element 18 consists of a substrate 22 of semiconductive material, typically silicon, in which a source region 24 and a drain region 26, each of opposite conductivity type to the substrate 22, have been formed by conventional methods. The source and drain regions 24 and 26 are separated by a channel region 28.

For purposes of illustration, the MIS readout element 18 consists of a P-type silicon substrate 22 into which N-type source and drain regions 24 and 26 have been diffused. The MIS readout element 18, so constructed, will operate in the enhancement mode, i.e. in the absence of an electric field of sufficient magnitude in the channel region 28, no current will flow between the source region 24 and the drain region 26.

A thin passivating or insulating layer 34 may be formed on the substrate 22. This layer 34 is typically $SiO_2$ and is also formed by conventional methods. A source contact 30 and a drain contact 32 are connected through windows in the passivating layer 34 to the source region 24 and the drain region 26, respectively.

The MIS readout element 18 and the dielectric storage medium 10, are connected to external circuitry as shown in FIG. 2. Connected in series between the source contact 30 and the drain contact 32, a voltage source $V_{DD}$ and a suitable detecting means 36, e.g., a current detector, may be seen. Further, the conductive layer 16 is connected through a switch 37 to a signal source 35. The particular signals which emanate from the signal source 35 will depend on the mode of operation of the device as will be more fully described below.

The device of the present invention may be operated in either a digital, analog, or digital-to-analog mode. The operation of the device in the digital mode will best be understood by reference to FIG. 2 in which the dielectric storage medium 10 is illustrated as being charged at locations 10b, 10d, and 10f, and uncharged at locations 10a, 10c, 10e and 10g. In the digital mode, a charged area may represent a first logical state and an uncharged area a second state. In FIG. 2, the charge is illustrated as a positive surface charge, but those skilled in the art will realize that the dielectric storage medium 10 could be negatively charged as well. The maximum charge at any location on the dielectric storage medium 10 is chosen such that the field which it induces will not be sufficient to cause current to flow between the source 24 and the drain 26 even when the readout device 18 is aligned directly over a charged storage location such as that shown in FIG. 2. However, if it is desired to determine whether a charge is stored at a particular storage location, an interrogation signal from the signal source 35, preferably a pulse, is applied to the conductive sheet 16 by closing the switch 37. The magnitude of signal is chosen such that the field in the channel region, produced solely by the presence of the interrogation signal will not be sufficient to allow a current to flow in the channel region 28. However, if as illustrated in FIG. 2, the MIS readout element 18 is aligned over a charged storage location, the field produced by the interrogation signal in combination with that produced by the charge on the dielectric 10, will be sufficient to cause a current to flow in the channel region 28. This current is detected by any suitable detecting means such as the current-detecting means 36. So constructed, the present invention will detect digital information stored on the dielectric storage medium 10. It should be recognized that the detecting means 36 could be charge rather than current responsive. For example, the detecting means could comprise a charge storage means such as a capacitor in combination with a device for measuring the charge accumulated over a suitable integration period.

Once the desired information has been obtained, the dielectric storage medium 10 may be removed from readout element 18 and the charge thereon erased, for example, by placing it in a suitable electric field. It may be subsequently recharged as desired.

The readout element 18 of the present invention is easily adaptable to the readout of analog information. To operate the device in the analog mode, the interrogation signal is time dependent, preferably a ramp rather than a pulse as used in the digital mode. The ramp interrogation signal is initiated at time $t = 0$ and it increases linearly with time. The stored charge located on the dielectric storage medium 10 is not sufficient, separately by itself, to turn on the readout device 18; however, as the field produced by the ramp interrogation signal increases, a time will be reached when the combination of the fields produced by the stored charge and the interrogation signal will turn on the MIS readout element 18. Then, by measuring the elapsed time from the time the interrogation signal is initiated until the time a current is detected by detecting means 36, the amount of stored charge may be determined, since the elapsed time will be a linear function of the stored charge.

The device of the present invention is also easily adapted for use as an analog to digital converter. Using this mode, if information of an analog nature is stored on the dielectric storage medium 10 in the form of a stored charge having a magnitude between zero and some maximum value, this information may be digitized by application of a staircase-shaped interrogation signal from the signal source 35. By noting the particular step of the staircase at which current detector 36 registers an output, digital information corresponding to the stored charge on dielectric 10 will be obtained.

The device of the present invention may be adapted to prevent erroneous readouts triggered by noise in environments in which such an application might be desirable. A device so equipped to eliminate erroneous readouts is illustrated in FIG. 3 in which a signal from a high-frequency oscillating signal source 38 is added by means of a summing amplifier 40 to the interrogation signal emanating from the signal source 35. The combined signal is applied to the conductive layer 16. The frequency of the signal emanating from the oscillating source 38 is high when compared to the frequency at which $1/f$ noise is significant, for example, it may be chosen to be on the order of about a megahertz, and the magnitude of the field produced by the signal is low when compared to the maximum field induced by charges on the dielectric storage medium 10. Specifically, the magnitude of the oscillating signal is chosen such that readout device 18 will not exhibit an output even when the stored charge on the dielectric storage medium 10 is at a maximum and the oscillating charge is simultaneously applied to the conductive sheet 16. However, if a stored charge is present at a particular storage location and the oscillating signal and the interrogation signal are applied at the same time, the MIS readout element 18 will turn on. In the output stage of the readout device 18, a filter 42 is disposed between the drain contact 32 and the detecting means 36. The filter 42 is of any conventional type and is tuned to pass only the frequency of the signal emanating from the oscillating signal source 38. Using this arrangement, the detecting means 36 will respond only to the presence or absence of an oscillating signal in the drain line and will not be triggered by noise of any frequency other than that in the filter bandpass. Further, the detecting means 36 and the filter 42 may be comprised of a phase sensitive detector which relies on the signal from oscillating signal source 38 as a reference. In this way, an output is recorded only when an oscillating signal is found in the drain line which is both of the same frequency as the signal emanating from the oscillating signal source 38, and in phase with it.

The readout device of the present invention is especially useful in reading out information stored in an array such as that illustrated in FIG. 4. There, a plurality of MIS readout elements 18, each similar to that shown in FIG. 1, are disposed in an $m \times n$ dimensional array. Only those readout elements at the corners of the array 18(1,1), 18(1,n), 18(m,1) and 18(m,n) are numbered for the sake of clarity. Each of the $m$ rows of MIS elements 18 is aligned respectively over strips 10(1), 10(2), 10(3), 10(m-1), and 10(m), of dielectric storage material. Each of these strips of dielectric material is provided with an electrically conductive sheet similar to the sheet or layer 16 of conductive material as shown in FIG. 1 and each sheet 16 is connected via switches 44(1), 44(2), 44(3), 44(m-1) and 44(m) to the interrogation signal source 35. The ohmic contacts to the source and drain region of each column of readout elements 18 are connected to common source lines 30(1), 30(2), 30(3), 30(4), 30(n-1) and 30(n) and common drain lines 32(1), 32(2), 32(3), 32(4), 32(n-1) and 32(n), respectively. Each of the common drain lines are connected to ground and each of the common source lines are connected to switches 45(1), 45(2), 45(3), 45(4), 45(n-1) and 45(n).

To read out information from a particular storage location $(i,j)$ of the array of FIG. 4, the switch 45(j) of the column being accessed is closed thus connecting the common source and drain lines of the column being accessed to a detecting means 36 in series with a voltage source $V_{DD}$. Further the ith switch 44, i.e. the switch of the row being accessed is closed. In this way, information may be read out from the dielectric storage media 10 a bit at a time. Those skilled in the art, of course, recognize that all switching could be done automatically.

Further, it is possible to read out information a row rather than a bit at a time if the array of FIG. 5 is employed. The array shown in FIG. 5 is the same as that shown in FIG. 4 except that each of the common source lines 30(1), 30(2), 30(3), 30(4), 30(n-1) and 30(n) are connected to a voltage source $V_{DD}$ and each of the common drain lines 32(1), 32(2), 32(3), 32(4), 32(n-1) and 32(n) are connected to resistors 46(1), 46(2), 46(3), 46(4), 46(n-1) and 46(n), respectively. These resistors are connected through capacitors 48(1), 48(2), 48(3), 48(4), 48(n-1) and 48(n), respectively, to ground. By closing the switch 44 of the row to be accessed, the capacitors 46 will charge to a voltage representative of the charge stored at each storage location of the row being accessed, which voltage may be detected by any suitable detecting means 36 (not shown).

The arrays shown in FIGS. 4 and 5 are particularly advantageous in that information may be read out from them without the need for extensive cross-over connections in view of the fact that the input and output terminals of the device of the present invention are found on opposite surfaces of the array.

Finally, FIG. 6 illustrates a device for sequentially reading out all the information stored on a dielectric storage medium, rather than only reading out selected portions of the stored information, such as that accomplished by the devices of FIGS. 4 and 5. FIG. 6 illustrates a dielectric storage medium 10, upon which a plurality of storage locations 1 through 9 are found which have been selectively charged. Disposed on the back surface, but not shown, is a conductive sheet or layer 16 to which an interrogation signal from the signal source 35 is applied. The dielectric storage medium 10 is advanced toward a readout head 52 which consists of a plurality of MIS readout elements 18(a), 18(b), 18(c), and 18(d), arranged obliquely to the path of the oncoming storage medium 10. Alternatively, the MIS readout elements could be arranged normal to the path of the storage medium 10 and the storage locations could be staggered. The source leads 30 of each MIS readout element 18 are connected through switches 55 to a common source lead 54 and the drain leads 32 are connected to a common drain lead 56. The leads 54 and 56 are connected to the current detecting means 36 and to voltage source $V_{DD}$. The switches 55 are sequentially closed and as the storage medium 10 advances in the direction illustrated, a first storage location 1 will reach the MIS readout element 18(a) and the device will register an output depending on the presence or absence of charge at that storage location. This will be followed by a readout of the location 2 by MIS readout element 18(b) and so on until each storage location is accessed sequentially.

Finally, it should be noted that while in each of the embodiments shown herein the conductive sheet 16 has been described as formed on the dielectric storage medium 10, those skilled in the art will recognize that the layer 16 may also be a separate body which is disposed adjacent to the first surface 12 of the dielectric storage medium 10. Further the conductive sheet 16 need not be continuously formed on the dielectric storage medium 10. It is only necessary that the conductive sheet be formed on that portion of the dielectric storage medium 10 which is opposite the channel region 28 during readout.

What is claimed is:

1. A device comprising:
   a dielectric storage medium having a first surface and a second opposite surface, said storage medium being capable of holding an electrostatic charge;
   an electrically conductive sheet disposed adjacent said first surface;
   a substrate of semiconductive material having a source region and a drain region formed therein and with a channel region therebetween, said second surface being removably placed adjacent to said substrate;
   means for applying an interrogation signal to said conductive sheet; and
   means for detecting a current flow between said source region and said drain region.

2. The device of claim 1, wherein said substrate has a passivating layer formed thereon.

3. The device of claim 1, wherein said substrate is separated from said sheet by means of a gaseous dielectric.

4. The device of claim 1, wherein said electrically conductive sheet is formed on said first surface of said dielectric storage medium.

5. The device of claim 1, wherein said signal is time dependent.

6. The device of claim 6, wherein said signal is a ramp.

7. The device of claim 6, wherein said signal is a staircase.

8. The device of claim 1, wherein said signal is a pulse.

9. The device of claim 1, including a means for summing an oscillating signal having a frequency to said interrogation signal and wherein said means for detecting includes a filter tuned to pass a signal having the frequency of said oscillating signal.

10. The device of claim 1, wherein said detecting means comprises a phase sensitive detector.

* * * * *